United States Patent
Chowdhury et al.

(10) Patent No.: US 9,356,512 B2
(45) Date of Patent: May 31, 2016

(54) ENVELOPE TRACKING POWER SUPPLY WITH DIRECT CONNECTION TO POWER SOURCE

(71) Applicant: Broadcom Corporation, Irvine, CA (US)

(72) Inventors: Debopriyo Chowdhury, San Diego, CA (US); Ali Afsahi, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 47 days.

(21) Appl. No.: 14/018,648

(22) Filed: Sep. 5, 2013

(65) Prior Publication Data

US 2015/0028829 A1    Jan. 29, 2015

Related U.S. Application Data

(60) Provisional application No. 61/859,419, filed on Jul. 29, 2013.

(51) Int. Cl.
| | | |
|---|---|---|
| *H04B 1/22* | (2006.01) | |
| *H04L 27/04* | (2006.01) | |
| *H04B 1/04* | (2006.01) | |
| *H02M 3/158* | (2006.01) | |
| *H03F 1/02* | (2006.01) | |
| *H03F 3/24* | (2006.01) | |
| *H02M 1/00* | (2006.01) | |

(52) U.S. Cl.
CPC ............. *H02M 3/158* (2013.01); *H03F 1/0227* (2013.01); *H03F 3/24* (2013.01); *H02M 2001/0022* (2013.01)

(58) Field of Classification Search
CPC ..................... H02M 3/158; H02M 2001/0022; H04B 1/04; H04B 1/66; H03F 1/00; H04L 27/04; H04L 27/08; H04L 27/2032
USPC ................ 455/102, 127.1, 108–113, 91, 129; 375/308
See application file for complete search history.

(56) References Cited

U.S. PATENT DOCUMENTS

| | | | | |
|---|---|---|---|---|
| 5,041,895 | A  * | 8/1991 | Contiero et al. | 257/370 |
| 6,236,084 | B1 * | 5/2001 | Harada et al. | 257/338 |
| 6,255,154 | B1 * | 7/2001 | Akaishi et al. | 438/217 |
| 6,437,641 | B1 * | 8/2002 | Bar-David | 330/10 |
| 7,026,868 | B2 * | 4/2006 | Robinson et al. | 330/10 |
| 7,696,818 | B2 * | 4/2010 | Kunihiro et al. | 330/10 |

(Continued)

FOREIGN PATENT DOCUMENTS

EP            02685343 A1 * 12/2012

OTHER PUBLICATIONS

Pritiskutch, J., et al., "Understanding LDMOS Device Fundamentals," STMicroelectronics, Jul. 2000, 4 pages.

*Primary Examiner* — Pablo Tran
(74) *Attorney, Agent, or Firm* — Brinks Gilson & Lione

(57) ABSTRACT

A communication device, such as a smart phone, includes an envelope tracking power supply. The envelope tracking power supply is configured for direct connection to a supply voltage. The direct connection may be made without connection through an intermediate voltage regulator, such as a low drop out regulator. The supply voltage may be a relatively high battery voltage, for example, that would normally result in greater than permissible voltage limits on the transistors used in conventional envelope tracking power supplies.

20 Claims, 7 Drawing Sheets

(56) References Cited

U.S. PATENT DOCUMENTS

| | | | |
|---|---|---|---|
| 7,701,690 B1 * | 4/2010 | Li et al. | 361/159 |
| 8,072,196 B1 * | 12/2011 | Li | 323/266 |
| 8,190,926 B2 * | 5/2012 | Vinayak et al. | 713/300 |
| 8,405,456 B2 * | 3/2013 | Drogi et al. | 330/127 |
| 8,620,240 B2 * | 12/2013 | Yamanouchi et al. | 455/127.1 |
| 2009/0004981 A1 | 1/2009 | Eliezer et al. | |
| 2011/0300816 A1 * | 12/2011 | Collados et al. | 455/102 |
| 2013/0217345 A1 * | 8/2013 | Balteanu et al. | 455/84 |
| 2014/0009130 A1 * | 1/2014 | Galbis et al. | 323/271 |
| 2015/0048883 A1 * | 2/2015 | Vinayak | 330/127 |

* cited by examiner

ENVELOPE TRACKING POWER SUPPLY WITH DIRECT CONNECTION TO POWER SOURCE

CROSS REFERENCE TO RELATED APPLICATIONS

This application claims priority to U.S. Provisional Application Ser. No. 61/859,419, filed Jul. 29, 2013, which is incorporated by reference in its entirety.

TECHNICAL FIELD

This disclosure relates to envelope tracking power supplies that may be used, for example, in wireless communication devices.

BACKGROUND

Rapid advances in electronics and communication technologies, driven by immense customer demand, have resulted in the widespread adoption of mobile communication devices. The extent of the proliferation of such devices is readily apparent in view of some estimates that indicate that the number of wireless subscriber connections is nearly equal to the population of the entire world. Improvements in wireless communication devices will help continue to make such devices attractive options for the consumer.

DETAILED DESCRIPTION

The discussion below makes reference to envelope tracking power supplies in devices such as user equipment (UE). UE may take many different forms and have many different functions. As one example, UE may be a 2G, 3G, or 4G/LTE cellular phone capable of making and receiving wireless phone calls, and transmitting and receiving data. The UE may also be a smartphone that, in addition to making and receiving phone calls, runs any number or type of applications. The UE may be a connectivity platform supporting Wireless LAN (WLAN), Bluetooth and other communication standards. UE may be virtually any device that transmits and receives information, including as additional examples a driver assistance module in a vehicle, an emergency transponder, a pager, a satellite television receiver, a networked stereo receiver, a computer system, music player, or virtually any other device. The techniques discussed below may also be implemented in other devices, such as a base station or other network controller that communicates with the UE.

Figure 1:
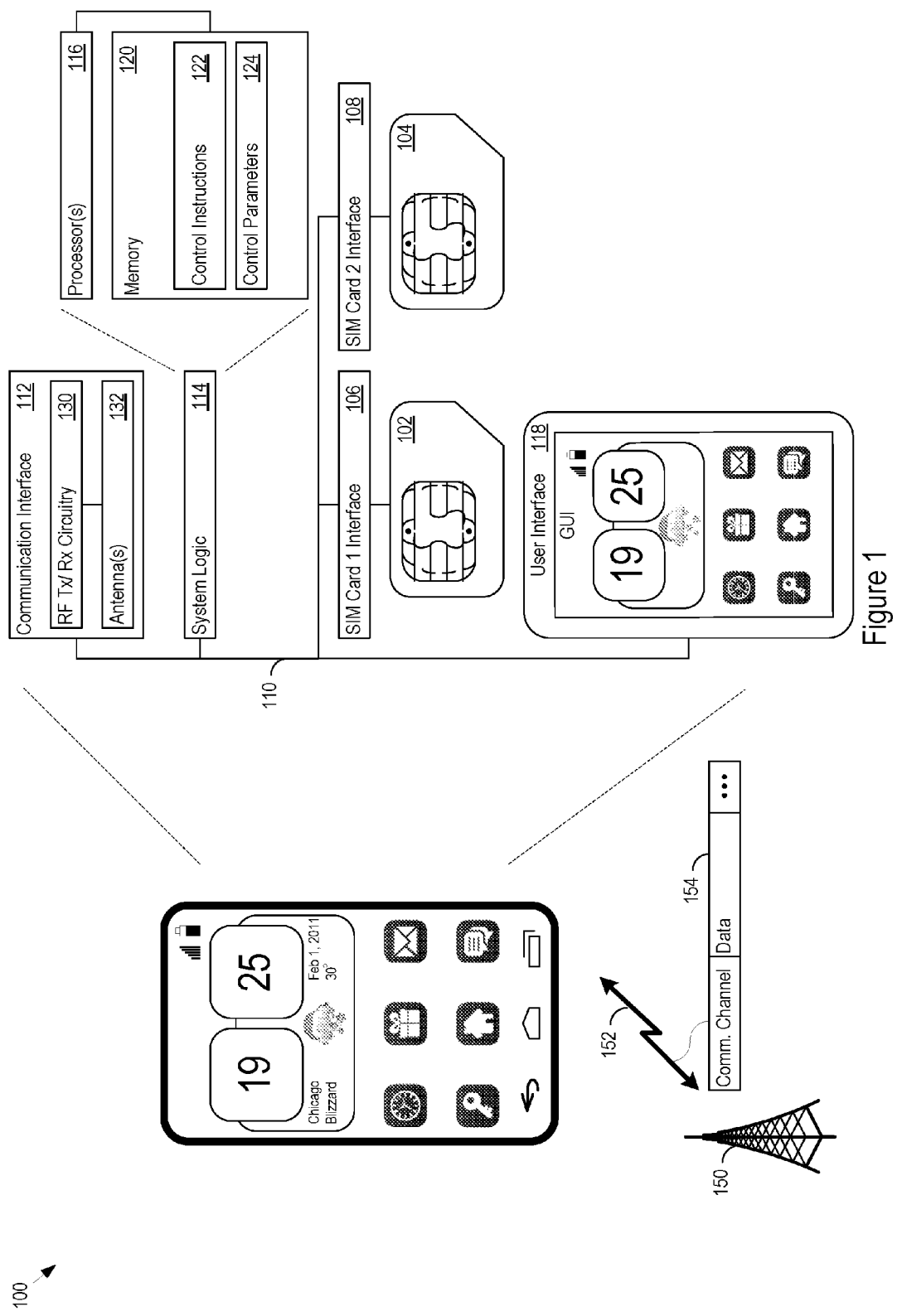
FIG. 1 shows an example of user equipment.

FIG. 1 shows a particular example of a UE 100 in which the direct connection techniques of the envelope modulator may be implemented. In this particular example, the UE 100 is a smartphone, but as noted above, the UE may be virtually any type of electronic device. The UE 100 is in communication with a network controller 150, such as an enhanced Node B (eNB) or other base station. The network controller 150 and UE 100 establish communication channels 152 and exchange data 154 of any type. In this example, the UE 100 supports one or more Subscriber Identity Modules (SIMs), such as the SIM1 102 and the SIM2 104. Electrical and physical interfaces 106 and 108 connect SIM1 102 and SIM2 104 to the rest of the user equipment hardware, for example, through the system bus 110.

The UE 100 includes a communication interface 112, system logic 114, and a user interface 118. The system logic 114 may include any combination of hardware, software, firmware, or other logic. The system logic 114 may be implemented, for example, in a system on a chip (SoC), application specific integrated circuit (ASIC), or other circuitry. The system logic 114 is part of the implementation of any desired functionality in the UE 100. In that regard, the system logic 114 may include logic that facilitates, as examples, running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 118. The user interface 118 may include a graphical user interface, touch sensitive display, voice or facial recognition inputs, buttons, switches, speakers and other user interface elements.

In the communication interface 112, Radio Frequency (RF) transmit (Tx) and receive (Rx) circuitry 130 handles transmission and reception of signals through the antenna(s) 132. The communication interface 112 may include one or more transceivers. The transceivers may be wireless transceivers that include modulation/demodulation circuitry, digital to analog converters (DACs), shaping tables, analog to digital converters (ADCs), filters, waveform shapers, filters, pre-amplifiers, power amplifiers and/or other logic for transmitting and receiving through one or more antennas, or (for some devices) through a physical (e.g., wireline) medium. In particular, the communication interface 112 may include envelope tracking power supplies that are enhanced for direct connection to a supply voltage as described below. A wide variety of chipsets, available from Broadcom Corporation of Irvine Calif., may implement any desired functionality in the UE 100.

The UE 100 may implement any desired wired or wireless communication technologies. Accordingly, the transmitted and received signals may adhere to any of a diverse array of formats, protocols, modulations (e.g., QPSK, 16-QAM, 64-QAM, or 256-QAM), frequency channels, bit rates, and encodings. As one specific example, the communication interface 112 may support transmission and reception under the 4G/Long Term Evolution (LTE) standards. The enhancements described below to the envelope tracking power supply are applicable to other communications technologies whether arising from the 3rd Generation Partnership Project (3GPP), GSM (R) Association, Universal Mobile Telecommunications System (UMTS), High Speed Packet Access (HSPA)+, or other partnerships or standards bodies. Note also that the UE 100 may implement any other desired communication technologies, including 802.11 a/b/g/n/ac/ad, Bluetooth, and Near Field Communications, as just a few examples.

The system logic 114 may include one or more processors 116 and memories 120. The memory 120 stores, for example, control instructions 122 that the processor 116 executes to carry out desired functionality for the UE 100. The control parameters 124 provide and specify configuration and operating options for the control instructions 122.

Figure 2:
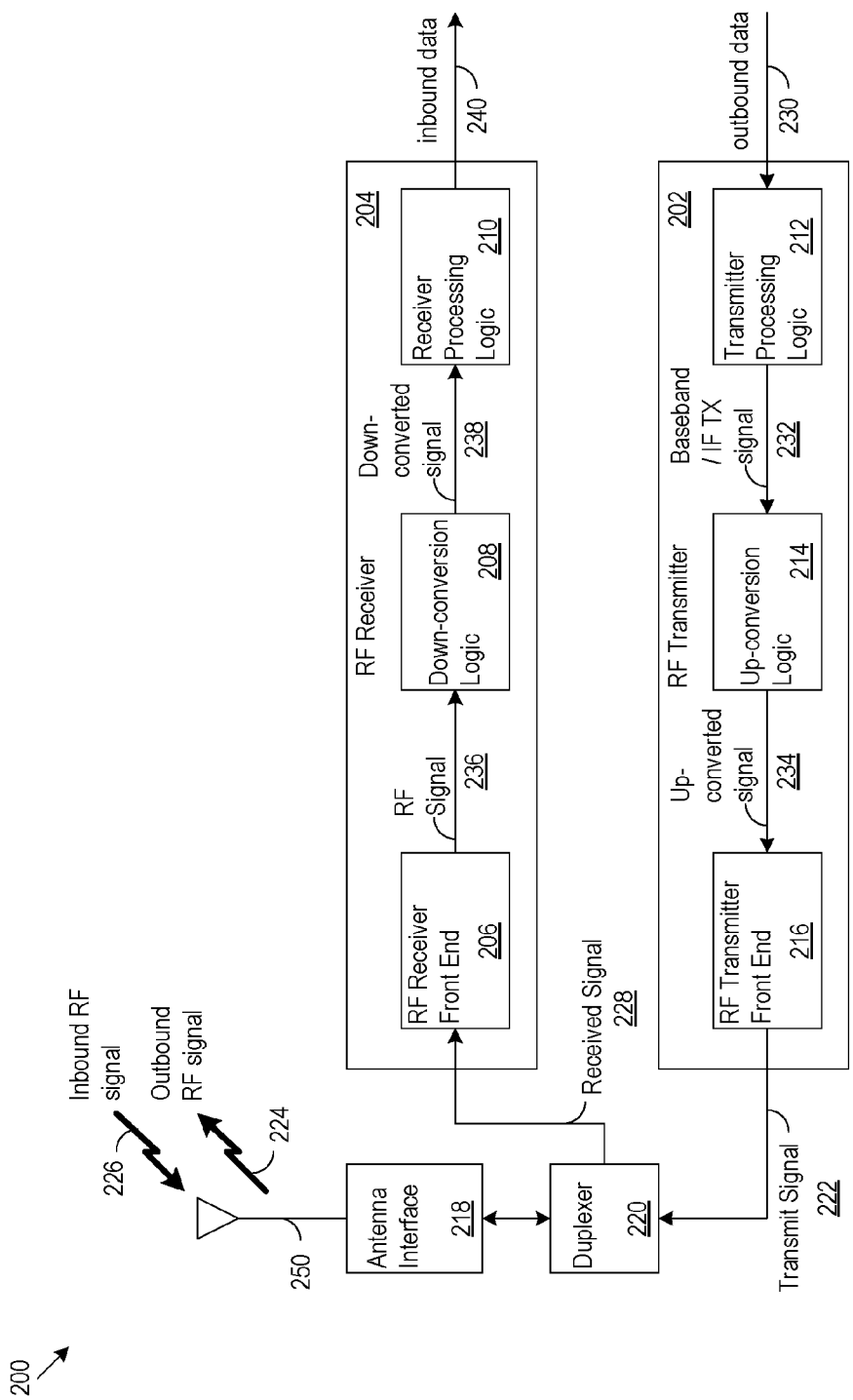
FIG. 2 shows an example of a radio transceiver.

FIG. 2 shows an example of a radio transceiver 200 that may be used in the UE 100 or any other UE. The radio transceiver 200 includes an RF transmitter 202 and an RF receiver 204. The RF receiver 204 includes a RF receiver front end 206, down-conversion logic 208 and receiver processing logic 210. The RF transmitter 202 includes transmitter processing logic 212, up-conversion logic 214, and a RF transmitter front end 216.

The RF receiver 204 and RF transmitter 202 are each coupled to an antenna 250 through an antenna interface 218 and a duplexer 220. The duplexer 220 couples the transmit signal 222 to the antenna 250 to produce the outbound RF signal 224, and couples the inbound RF signal 226 to the receive path to capture a received signal 228. Alternatively, a transmit/receive switch can be used in place of duplexer 220.

The RF transmitter 202 receives outbound data 230. The transmitter processing logic 212 formats the outbound data 230 in accordance with any particular protocol to produce a baseband or low intermediate frequency (IF) transmit (TX) signal 232, which may include an outbound symbol stream that contains outbound data 230. The baseband or low IF TX signals 232 may be digital baseband signals (e.g., have a zero IF) or IF signals, where the IF may, as just one example, be in a frequency range of one hundred kilohertz to a few megahertz. Note that the processing performed by the transmitter processing logic 212 can include, as examples, scrambling, encoding, puncturing, mapping, encryption, modulation, and digital baseband to IF conversion.

The up-conversion logic 214 includes, for examples, a digital-to-analog conversion (DAC) module, a filtering and/or gain module, and a mixing section. The DAC module converts the baseband or low IF TX signals 232 from the digital domain to the analog domain. The filtering and/or gain module filters and/or adjusts the gain of the analog signals prior to providing the signals to the mixing section. The mixing section converts the analog baseband or low IF signals into up-converted signals 234 according to the frequency of the transmitter local oscillator used for mixing.

The radio transmitter front end 216 includes a power amplifier and may also include a transmit filter module. The power amplifier amplifies the up-converted signals 234 to produce the transmit signals 222. The transmitter transmits the outbound RF signals 224 via an antenna interface 218 coupled to the antenna 250. The antenna interface 218 may provide impedance matching and optional bandpass filtration, as examples.

The power amplifier consumes a significant fraction of the overall power consumed by the UE. Accordingly, techniques that reduce the power consumption of the power amplifier can have significant impact on the overall battery life of the UE. In order to enhance the efficiency of the power amplifier, an envelope tracking power supply modulator may provide the voltage supply to the power amplifier. In fixed voltage implementations, the power amplifier is operated from a constant supply voltage. However, in systems the involve modulation standards that incorporate high peak-to-average power ratios (PAPR), varying the power amplifier power supply (instead of holding it constant) according to the envelope of the RF input signal can lead to substantial power savings. Certain techniques are presented below that allow the envelope tracking power supply to directly connect to a voltage supply, e.g., the battery voltage, and thereby save power and achieve other advantages.

The RF receiver 204 receives inbound RF signals 226 via the antenna 250 and antenna interface 218 and provides the received signals 228 to the RF receiver front end 206. The antenna interface 218 may provide impedance matching of the antenna 250 to the RF receiver front end 206 and bandpass filtering of the inbound RF signals 226, as examples. The RF receiver front end 206 recovers the RF signal 236.

The down conversion logic 208 may include a mixing section, an analog to digital converter (ADC), filtering logic, and gain control, as examples. The mixing section converts the RF signal 236 into a down converted signal 238 at an IF corresponding to a local oscillator used in the mixing section. The ADC converts the analog baseband or IF signal into a digital baseband or IF signal. The resulting signal includes an inbound symbol stream.

The receiver processing logic 210 processes the baseband or IF signal 238 according to any implemented protocol to produce inbound data 240. Examples of the processing performed by the receiver processing logic 210 include digital intermediate frequency to baseband conversion, demodulation, demapping, depuncturing, decoding, decryption, and descrambling.

Figure 3:
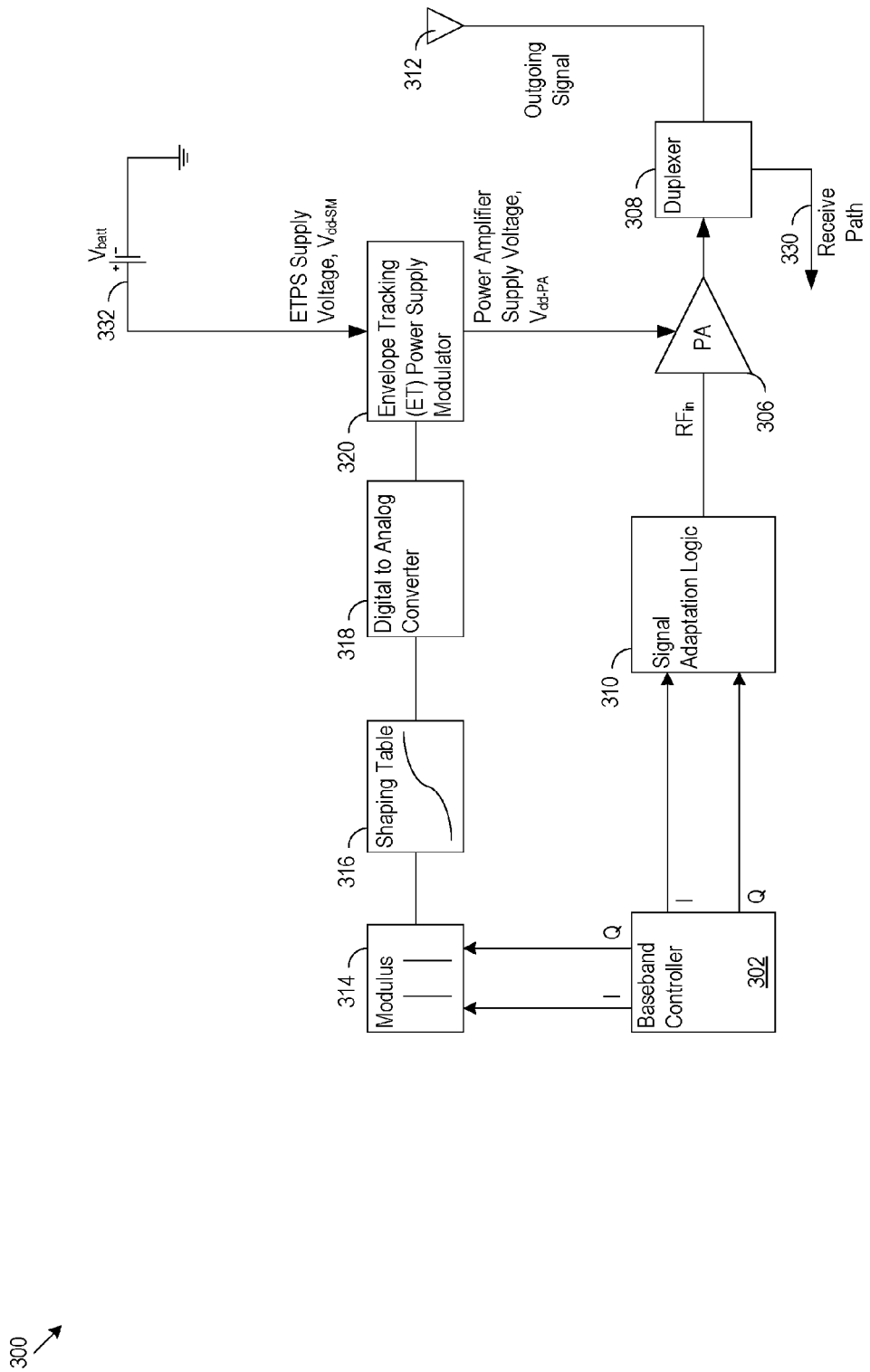
FIG. 3 is an example of a radio transmitter.

FIG. 3 shows an example transmitter 300 that may be present in the UE 100. The transmitter 300 may be implemented by any combination of a baseband controller, RF IC, power amplifier, and envelope tracking power supply, and other circuitry. Accordingly, the transmitter 300 may map to one or more portions of the communication interface 112 and the system logic 114.

In the example in FIG. 3, the transmitter 300 includes a baseband controller 302, a power amplifier (PA) 306, and a duplexer 308. Signal adaptation logic 310 is also present, and may modify the transmit signal samples generated by the baseband controller 302, prior to generation of the preamplifier output signal Vpa that drives the PA 306. As just a few examples, the signal adaptation logic 310 may implement digital predistortion; pre-emphasis or baseband gain; I and Q DACs, analog filters, and mixers for upconversion to a selected center frequency; and pre-amplification by a PA driver. The duplexer 308 may implement a transmit/receive switch under control of the system logic 114, e.g., under control of the baseband controller 302. In one switch position, the duplexer 308 passes amplified transmit signals from the PA 306 through the antenna 312. In a different switch position, the duplexer 308 passes received signals from the antenna 312 to a receive path for further processing.

The baseband controller 302 may be part of the system logic 114. The baseband controller 302 provides, e.g., inphase/quadrature (I/Q) signal samples of a desired transmit signal to the modulus logic 314. The modulus logic 314 may output the absolute value (e.g., the square root of I squared plus Q squared) of the transmit signal to a shaping table 316. The shaping table 316 maps input values to output values in a linear or non-linear manner. The output of the shaping table 316 feeds the digital to analog converter (DAC) 318. In turn, the DAC 318 outputs the envelope of the transmit signal as modified by the shaping table as a reference input signal to the envelope tracking power supply modulator 320 ("supply modulator 320").

The supply modulator 320 receives the reference envelope signal from the DAC 318. The supply modulator 320 outputs a PA power supply voltage, $V_{dd\text{-}PA}$, that approximately follows the envelope signal. The supply modulator 320 creates $V_{dd\text{-}PA}$ using the supply modulator 320 power supply voltage, $V_{dd\text{-}SM}$, as its power source. In other words, for the directly connected supply modulator (e.g., 320, 600, and 700), $V_{dd\text{-}SM} = V_{batt}$, whereas for a supply modulator (e.g., 502) that receives a fixed DC voltage input, $V_{dd-SM}$=3.3 V, for example. As will be described in detail below with respect to FIGS. 6 and 7, the supply modulator 320 is configured for direct connection to a relatively high voltage of the power supply 332, such as a system battery. The supply voltage $V_{dd-SM}$ for the directly connected supply modulators described in FIGS. 3, 4, 6, and 7 may be of sufficient magnitude that it would normally result in greater than permissible voltage stresses on the nanoscale CMOS transistors used in conventional envelope tracking power supplies. As examples, the supply voltage $V_{dd-SM}$ may vary between approximately 3V to 6V, but many other ranges are possible depending upon the battery and its charge and discharge characteristics.

Figure 4:
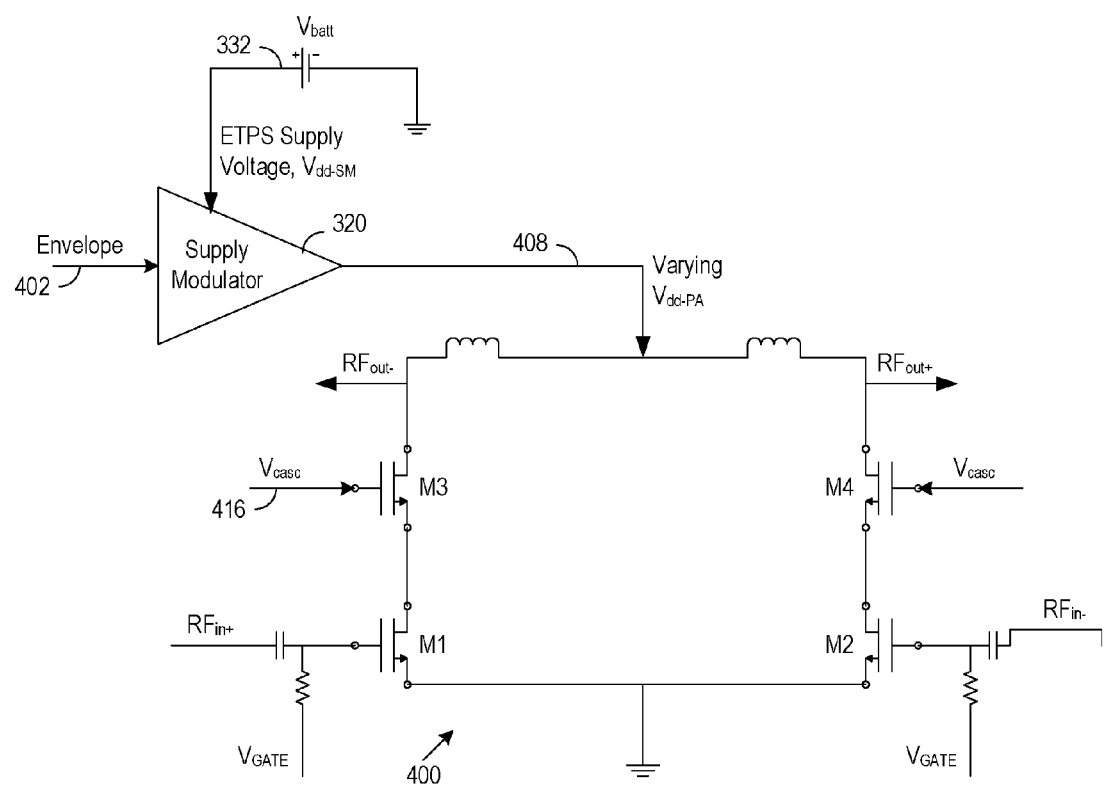
FIG. 4 shows an example implementation of a power amplifier.

FIG. 4 shows an implementation of envelope tracking CMOS cascode power amplifier circuitry 400 ("PA 400"). The supply modulator 320 may drive any other types of PA, however. Despite the particular type of PA, the supply modulator 320 may implement a connection to a power supply, such as the UE battery, without connecting through intervening voltage conditioning circuitry. The supply modulator 320 receives tracked envelope information in the envelope signal input 402 (e.g., from the DAC 318), and the supply modulator 320 generates an envelope tracking supply voltage $V_{dd-PA}$ on the voltage supply output 408.

The PA 400 may be implemented in nanoscale CMOS technology. The PA 400 employs a cascode configuration using a stack of thick-oxide and thin-oxide core devices. Transistors M1 and M2 are the thin-oxide core devices which amplify the input RF signal and determine the gain of the amplifier.

Transistors M3 and M4 are stacked on top of the thin-oxide devices, and are referred to as the cascode transistors. Transistors M3 and M4 may be thick-oxide devices that can withstand high voltage stress. This helps overcome the low breakdown voltages of the thin oxide devices and allows operation of the PA 400 from a higher supply voltage $V_{dd-PA}$ swings, such as swings up to 3.3V. This may improve the output power and efficiency of the PA 400. The cascode transistors M3 and M4 are biased by the bias voltages, e.g., $V_{CASC}$ 416.

In contrast to the implementations shown in FIGS. 4, 6, and 7, FIG. 5 shows a low drop out (LDO) regulator 500 used to provide a conditioned voltage supply to a supply modulator 502. The LDO regulator 500 conditions the battery voltage to provide a fixed DC voltage to the supply modulator 502, e.g., 3.3V. In some UEs, such as mobile battery-operated devices such as cell-phones, PDAs, and tablets, the fixed DC voltage is not readily available. That is, the battery voltage may be the only source of voltage. The battery voltage may vary over a significantly wide range, e.g. 3.0V-6.5V, depending upon the type of battery used. For that reason, the LDO 500 has been used to transform the varying battery voltage into a fixed DC voltage supply for the supply modulator 502.

Figure 5:
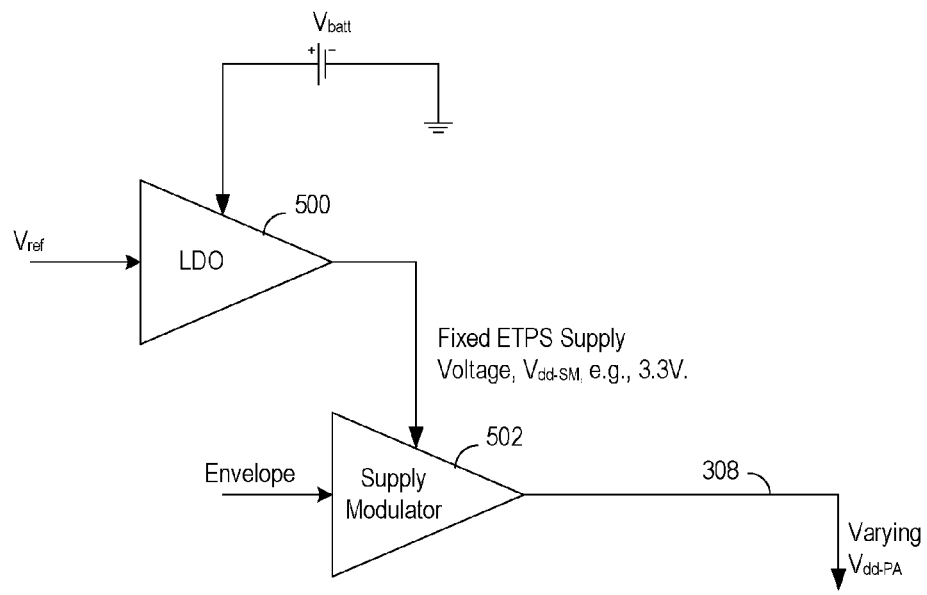
FIG. 5 shows a low drop out regulator used to provide a voltage supply to a supply modulator.

Regarding the efficiency of the design shown in FIG. 5, assume for example that the battery voltage is 5V and the desired supply modulator voltage is 3.0V. The LDO regulator 500 drops the excess voltage of 2V (5V-3V) across the LDO regulator 500. If 'Isupp' is the current provided by the LDO regulator 500, then 2*Isupp power is dissipated without benefit, thereby reducing system efficiency.

In contrast, in FIG. 4 the power supply 332 is unregulated in the sense that there is no intervening voltage conditioning circuitry between the power supply 332 and the supply modulator 320. For instance, there is no intervening LDO regulator that conditions the power supply 332 to generate a fixed DC voltage for the supply modulator 320. There may be other types of intervening circuitry, however, such as a voltage sensor, current sensor, or temperature sensor.

In some implementations, the power supply 332 is a battery, e.g., a smartphone battery. As the smartphone battery charges, the power supply voltage increases over time. Similarly, as the smartphone battery discharges, the power supply voltage decreases over time. The supply modulator 320 directly accepts the time varying supply voltage. To that end, the supply modulator 320 may include a circuit stage configured to accept relatively high input voltages produced by the power supply 332, as shown in FIG. 6.

Figure 6:
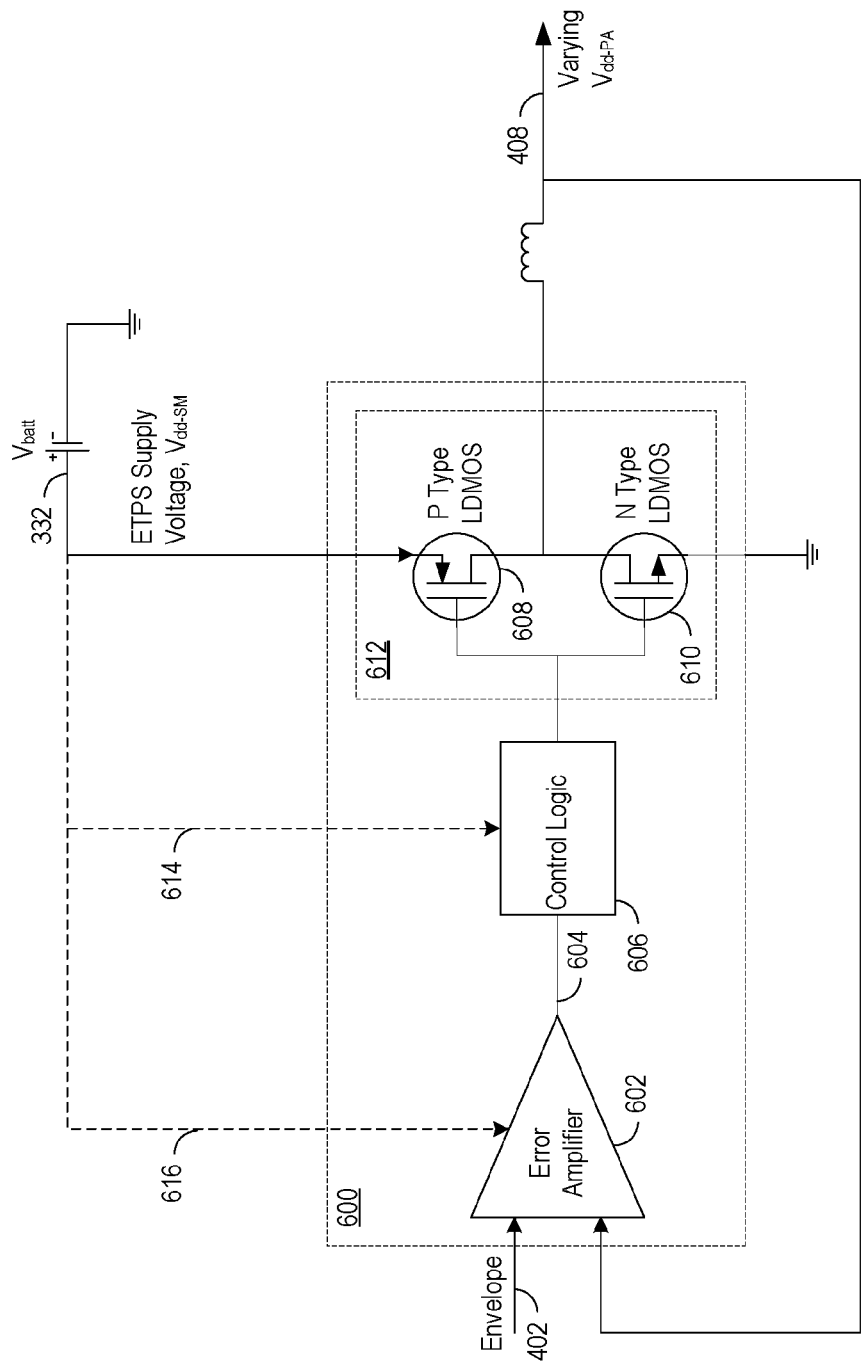
FIG. 6 shows an example supply modulator that directly connects to a voltage supply without using a low drop out regulator.

In particular, FIG. 6 shows a supply modulator 600 enhanced for direction connection to the power supply 332. In particular, the supply modulator 600 includes an output stage 612 that connects to the power supply 332 without using a low drop out regulator, or other voltage conditioning circuitry between the power supply 332 and the supply modulator 600. That is, the supply modulator 600 interfaces directly to the power supply 332, e.g., the battery, and in operation outputs the desired envelope tracking $V_{dd-PA}$.

In the supply modulator 600, an error amplifier 602 provides an error reference 604 to the control logic 606. The control logic 606 tries to minimize the error reference 604, which reflects the difference between the envelope signal input 402 and the $V_{dd-PA}$ on the voltage supply output 408 for the power amplifier. The control logic 606 drives the gates of the transistors 608 and 610 to adjust the voltage on the voltage supply output 408. The transistors 608 and 610 directly connect to the power supply 332 without the need for intermediate power conditioning circuitry (such as an LDO). In the example shown in FIG. 6, the transistors 608 and 610 are a P type LDMOS (Laterally Diffused Metal Oxide Transistor) and an N type LDMOS transistor, respectively.

There are a number of advantages. For example, the supply modulator 600 eliminates the need for an external LDO, thereby avoiding the power dissipation in the LDO, and improving system efficiency. As another example the supply modulator 600 may eliminate the hardware associated with the LDO design, including both on-chip as well as on-board components, and reduce the amount of die and circuit board space needed to support the envelope tracking operation. Further, the supply modulator 600 may harness the higher supply voltage to selectively increase the PA supply voltage. The increased PA supply voltage may increase the PA peak output power, thereby improving the net power output of the UE.

Note that the supply modulator 600 does not replicate the functionality of the LDO. Instead, for high efficiency, the control logic 606 produces $V_{dd-PA}$ directly from the voltage accepted by the supply modulator 600, $V_{dd-SM}$. The voltage conversion topology that the control logic 606 controls may be a buck regulator topology, for example. The buck regulator topology typically results in very high conversion efficiency.

The supply modulator 600 uses enhanced structure transistors in an output stage 612 that have a physical structure that supports the typically higher voltage stresses of direct connection to the system supply voltage. As noted above, in one implementation, the supply modulator 600 may include LDMOS transistors. The LDMOS transistors are compatible with traditional CMOS fabrication processes, however they can withstand much higher drain-source voltage as compared to nanoscale CMOS transistors. In particular, the LDMOS transistor is an asymmetric power MOSFET designed for low on-resistance and high blocking voltage. In order to have a higher drain operating voltage, the drain to channel electric field is lowered by a combination of isolation oxide and lightly doped drain.

The enhanced structure transistors facilitate the interface of the supply modulator 600 directly to the system supply voltage. Further, because of the compatibility of the enhanced structure transistors with standard CMOS fabrication processes, the enhanced structure transistors may be placed where desired to handle higher voltages. As the same time the transistors that do not need to withstand high voltages may remain conventional structure CMOS transistors.

Further, the direct connection to the supply voltage may extend to other circuitry in addition to the output stage 612 in the supply modulator 600. For instance, a supply voltage connection 614 may directly provide the supply voltage to the control logic 606. Similarly, a supply voltage connection 616 may directly provide the supply voltage to the error amplifier 602. Accordingly, any circuitry in the supply modulator 600 may directly (e.g., without prior voltage conditioning) connect to the supply voltage as long as the circuitry is designed to operate over the possible range of the supply voltage.

The LDMOS architecture shown above in FIG. 6 is one possible implementation of direct connection of the supply modulator 600 to the supply voltage (e.g., the UE battery voltage). The direct connection eliminates the inefficiency of the intermediate LDO or other voltage regulator. However, other implementations are possible.

Figure 7:
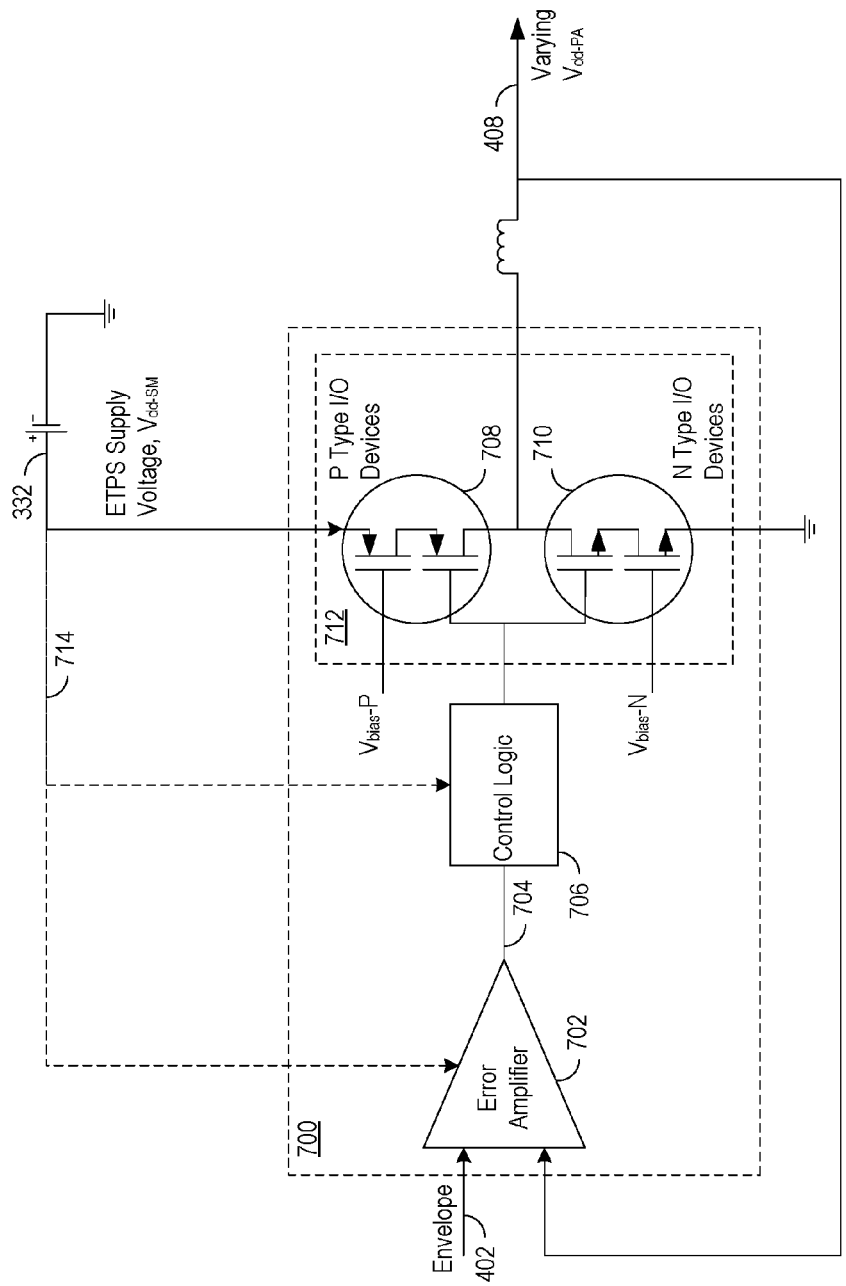
FIG. 7 shows another example of a supply modulator that directly connects to a voltage supply.

For instance, FIG. 7 shows another example of a supply modulator 700 that directly connects to a voltage supply. The supply modulator 700 includes an output stage 712 implemented with a stacked device configuration. Note that core transistors in a modern nanoscale CMOS technology have very small gate oxide thickness and can withstand only limited supply voltages. However, Input/Output (I/O) devices are available which have thicker gate oxide and hence can withstand higher voltages than the core transistors. While these I/O devices have less high frequency gain than their core counterparts, for many applications, like the supply modulator which essentially operates on baseband frequencies, such transistors may be suitable. As an example, while core transistors in a generic 40 nm CMOS technology, have a recommended supply voltage of about 1.0 V to 1.2 V, I/O devices can operate at 2.5 V or more, depending upon their channel length.

Accordingly, a supply modulator may employ such thicker oxide I/O devices as one option for using higher supply voltages. However, depending on the particular implementation, the battery voltage in a UE can exceed the reliable voltage limits of such I/O devices. While it may therefore not be ideal to use a single device for direct connection to the battery in some implementations, a stacked (e.g., cascode) configuration of such I/O devices may facilitate direct connection of the output stage to battery voltage. In FIG. 7, the output stage 712 is implemented with two stacked P type I/O devices 708 on the high side and two stacked N type I/O devices 710 on the low side. The P type cascode device is operated with a bias voltage $V_{bias}$-P, while the N type cascode device is operated with a bias voltage $V_{bias}$-N. The bias voltages help control the voltages appearing across the cascode connected P and N devices, to meet the voltage tolerances specified for those devices. A cascode configuration may also be used in connection with any other circuitry in the supply modulator 700. Accordingly, the power supply connection 714 may also provide a direct supply voltage connection to other circuitry in the supply modulator 700, such as the error amplifier 702 and the control logic 706.

While specific implementations have been shown and described, other implementations are possible. For example, the output stage 612 may employ transistors other than LDMOS transistors. Further, the output stage 612 may employ different types of switches altogether that, like the LDMOS transistors, are capable of direct connection to the voltage output of the power supply 332. In addition, the output stage 612 may include other configurations of devices that can accept the full voltage of the power supply 332. That is, the output stage 612 need not be a complementary P/N transistor output stage, a buck converter topology output stage, or any other specific type of output stage. In other implementations, the direct connection to the power supply 332 is made at other points in the supply modulator, such as an input stage that may then provide the supply voltage for the output circuitry of the supply modulator.

What is claimed is:

1. A power supply modulator comprising:
an envelope signal input;
a power amplifier voltage supply output;
an output stage configured to connect to an unregulated system power supply voltage, the output stage comprising:
a first laterally diffused metal oxide semiconductor (LDMOS) transistor coupled to a ground; and
a second LDMOS transistor configured to make a direct connection to the unregulated power supply, the first LDMOS transistor coupled between the second LDMOS transistor and the ground; and
control circuitry coupled to the output stage and the power supply voltage in parallel with the output stage, the control circuitry comprising a transistor structure that is voltage compatible with direct connection of the control circuitry to the unregulated system power supply voltage, the control circuitry configured to generate, on the power amplifier voltage supply output, an envelope tracking voltage responsive to the envelope signal input.

2. The power supply modulator of claim 1, where the unregulated system power supply comprises a system battery.

3. The power supply modulator of claim 1, where the output stage is configured for direct connection to the unregulated system power supply voltage without intermediate connection through a voltage conditioning circuit.

4. The power supply modulator of claim 1, where the output stage is configured for direct connection to the unregulated system power supply voltage without intermediate connection through a voltage regulator.

5. The power supply modulator of claim 1, where the output stage is configured for direct connection to the unregulated system power supply voltage without intermediate connection through a low dropout regulator.

6. The power supply modulator of claim 1, where the unregulated system power supply voltage comprises a varying supply voltage that decreases over time, increases over time, or both.

7. The power supply modulator of claim 1, where the unregulated system power supply voltage comprises a supply voltage provided by a cellular phone rechargeable battery.

8. The power supply modulator of claim 1, where:
the first LDMOS transistor comprises a p-type transistor; and
the second LDMOS transistor comprises an n-type transistor.

9. The power supply modulator of claim 1, where the control circuitry is configured to generate the envelope tracking voltage by driving gates of the first and second LDMOS transistors to reduce an error signal, where the error signal is responsive to a difference between the envelope signal input and the power amplifier voltage supply output.

10. A power supply modulator comprising:
a reference signal input;
a voltage supply output;

a voltage supply input;
an output stage configured to connect to the voltage supply input without intervening connection through a voltage regulator, the output stage comprising:
a first transistor;
a second transistor coupled to the first transistor;
a negative bias transistor coupled between a ground and the transistor; and
a positive bias transistor configured for connection transistor to the voltage supply input without intervening connection through a voltage regulator, the positive bias coupled between the second transistor and the voltage supply, the positive and negative bias transistors configured to hold a voltage provided to the first and second transistors within a specified voltage tolerance; and
control circuitry coupled to the first and second transistors and configured to generate, on the voltage supply output, an output voltage that follows the reference signal input.

11. The power supply modulator of claim 10, where the output voltage follows an envelope of a reference signal present on the reference signal input.

12. The power supply modulator of claim 10, where:
the first and second transistors are configured to withstand an input voltage greater than 4 V on the voltage supply input.

13. The power supply modulator of claim 10, where:
the voltage supply input carries a system battery voltage supply.

14. The power supply modulator of claim 10, where:
the voltage supply input carries a voltage supply that increases and decreases over time.

15. The power supply modulator of claim 10, where the control circuitry comprises an enhanced transistor structure to directly couple the control circuitry to the voltage supply input in parallel to the output stage, the control circuitry.

16. The power supply modulator of claim 10, where:
the first transistor comprises an n-type transistor;
the second transistor comprises a p-type transistor;
the negative bias transistor comprises an n-type transistor; and
the positive bias transistor comprises a p-type transistor.

17. A transmitter comprising:
a system power supply;
a radio frequency envelope signal input;
a power amplifier comprising:
a power amplifier supply voltage input; and
amplifier circuitry coupled to the radio frequency envelope signal input, the amplifier circuitry configured to amplify a radio frequency signal present on the radio frequency signal input;
an envelope tracking power supply modulator comprising:
an output stage connected to the system power supply without connecting through intervening voltage conditioning circuitry for the system power supply, the output stage comprising:
a first laterally diffused metal oxide semiconductor (LDMOS) transistor coupled to a ground; and
a second LDMOS transistor connected to the system power supply without connecting through intervening voltage conditioning circuitry for the system power supply, the first LDMOS transistor coupled between the second LDMOS transistor and the ground; and
an error amplifier responsive to the radio frequency envelope signal input and power amplifier supply voltage input; and
control circuitry coupled to the error amplifier, the output stage and the system power supply in parallel with the output stage, the control circuitry comprising a transistor structure that is voltage compatible with direct connection of the control circuitry to the system, the control circuitry configured to generate, on the power amplifier voltage supply input, an envelope tracking power supply voltage responsive to the radio frequency envelope signal input.

18. The transmitter of claim 17, where:
the system power supply comprises a rechargeable battery.

19. The transmitter of claim 17, where the system power supply comprises an unregulated system supply voltage that decreases over time.

20. The transmitter of claim 17, where the system power supply comprises an unregulated system supply voltage that increases over time.

* * * * *